(12) United States Patent
Sane et al.

(10) Patent No.: US 7,312,527 B2
(45) Date of Patent: Dec. 25, 2007

(54) LOW TEMPERATURE PHASE CHANGE THERMAL INTERFACE MATERIAL DAM

(75) Inventors: Sandeep B. Sane, Chandler, AZ (US); Nitin Deshpande, Chandler, AZ (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/305,527

(22) Filed: Dec. 16, 2005

(65) Prior Publication Data

US 2007/0138621 A1 Jun. 21, 2007

(51) Int. Cl.
*H01L 23/34* (2006.01)

(52) U.S. Cl. .............. 257/712; 257/686; 257/704; 438/122; 438/125

(58) Field of Classification Search .......... 257/712, 257/704, 687; 438/122, 125
See application file for complete search history.

(56) References Cited

U.S. PATENT DOCUMENTS

| 5,909,056 A * | 6/1999 | Mertol ............... 257/704 |
| 6,150,195 A | 11/2000 | Chiu et al. |
| 6,362,513 B2 | 3/2002 | Wester |
| 6,391,683 B1 * | 5/2002 | Chiu et al. ............ 438/108 |
| 6,891,259 B2 * | 5/2005 | Im et al. .............. 257/687 |
| 2006/0042054 A1 | 3/2006 | Kippes et al. |

OTHER PUBLICATIONS

Pending U.S. Appl. No. 11/095,693; Title: Structure and Method to Control Underfill ; Inventor: Sandeep B. Sane; filed Mar. 31, 2005.
Pending U.S. Appl. No. 11/072,112; Title: Method for Reducing Assembly-Induced Stress in a Semiconductor Die; Inventor: Deshpande et al.; filed Mar. 3, 2005.

* cited by examiner

*Primary Examiner*—Roy Potter

(57) ABSTRACT

A method, apparatus and system with a semiconductor package including a thermal interface material dam enclosing a volume of thermal interface material.

22 Claims, 7 Drawing Sheets

LOW TEMPERATURE PHASE CHANGE THERMAL INTERFACE MATERIAL DAM

TECHNICAL FIELD

The invention relates to the field of microelectronics and more particularly, but not exclusively, to packaging a microprocessor.

BACKGROUND

Under normal operation, an integrated circuit, for example a microprocessor, generates heat that must be removed to maintain the device temperature below a critical threshold and thereby maintain reliable operation. The threshold temperature derives from many short and long term reliability failure modes and may be specified by a circuit designer as part of a normal design cycle. The evolution of integrated circuit designs has resulted in higher operating frequency, increased numbers of transistors, and physically smaller devices. This continuing trend generates ever increasing area densities of integrated circuits and electrical connections. To date, this trend has resulted in both increasing power and increasing heat flux devices. Further, the trend may be expected to continue into the foreseeable future.

The problem of maintaining device temperature below a critical threshold value may be addressed at various levels of packaging. For example, a heat sink may be a common board level component, a fan a common system level component, and a thermally conductive packaging material a common device level component. A design team may choose various combinations of device, board, and system level components when faced with a particular thermal challenge.

Consider a device level component. Various materials in an electronic package typically each have a unique bulk linear coefficient of thermal expansion. As a result, under normal operation, temperature variations within a package may cause the various materials to undergo different levels of thermal expansion or contraction and may thus result in mechanical stresses within the various materials. Thus, a component used to address a thermal challenge may force further design consideration.

For example, a copper heat spreader may be thermally coupled to a backside of a die using a solder. Copper has a bulk linear coefficient of thermal expansion ("CTE") of approximately 16.5 ppm/° C. in contrast to silicon, which has a bulk linear CTE of approximately 2.6 ppm/° C. Thus, a unit volume of copper may expand considerably more than a unit volume of silicon. At room temperature, mechanical stresses resulting from solder attachment of a heat spreader to a die may thus depend on the solder's phase change temperature, with lower temperature solders resulting in lower mechanical stresses compared to higher temperature solders. See FIG. 1.

Further, an integrated circuit package may undergo several elevated temperature processes during manufacture. For example, a package may undergo a soldering process to attach a die to a substrate and the substrate may undergo a solder ball attach process. The assembled package may then undergo a solder process to attach the package to a motherboard. Often, each successive high temperature process occurs at a temperature lower than the previous one to avoid damage to an earlier completed portion of the package.

DETAILED DESCRIPTION

Figure 1:
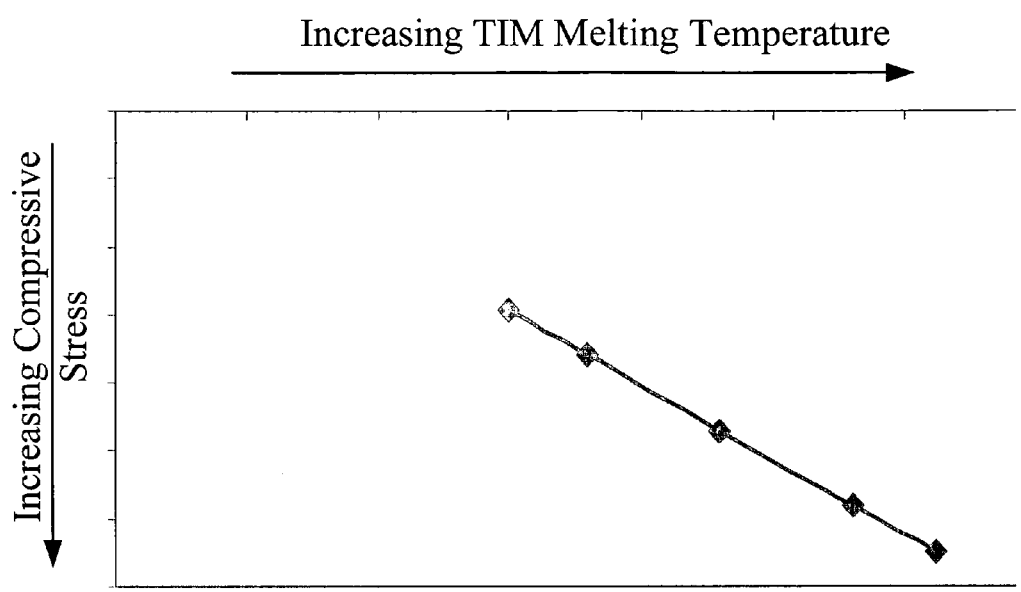
FIG. 1 illustrates a typical graph of compressive mechanical stress versus solder phase change temperature for die soldered to a copper heat spreader.

The following detailed description makes reference to the accompanying drawings, which form a part hereof and show specific embodiments by way of illustration. Regarding the drawings and detailed description, like numerals designate like parts throughout. Embodiments other than those presently described and illustrated may be practiced, and, further, structural and/or logical changes may be made, without deviating from the intended scope of the appended claims and their equivalents. Directions and references (e.g., up, down, top, bottom, primary side, backside, etc.) may be used to facilitate discussion of the drawings and are not intended to restrict the implementation of various embodiments not presently described or illustrated. Therefore, the following detailed description is not to be taken as limiting and only the appended claims and their equivalents define the broad range of possible embodiments.

Competing priorities may arise in packaging an integrated circuit. A priority of increasing system performance may drive package thermal performance, which in turn may drive considerations of package mechanical stress. Combined thermal performance and mechanical stress constraints may give rise to new manufacturing challenges. The following detailed description describes embodiments of a package, system, and manufacturing method that address possible competing priorities.

If power dissipation (hence rate of heat transfer from the package) and overall system performance correlate, overall system performance may suffer if a package overly constrains heat transfer from the package. Conversely, reduced package thermal resistance may improve the possibility of increased overall system performance.

In an electronic package where a major portion of the heat generated by a die may pass through a single external surface of the package, a model characterizing the rate of heat transfer, q, from the package is given by $q=\Delta T/R_{thermal}$, where $\Delta T$ represents a temperature gradient and $R_{thermal}$ represents a thermal resistance. The temperature gradient, $\Delta T$, describes the temperature difference between a temperature on the die and a temperature on the external surface through which the major portion of heat generated passes. The thermal resistance, $R_{thermal}$, describes the expected temperature gradient per unit heat transfer rate.

An allowable temperature gradient, $\Delta T_{allowable}$, may be constrained by system cooling capabilities, and by integrated circuit reliability concerns. Under a given power dissipation, a system may only be capable of cooling the external surface of the package to a given temperature. Further, integrated circuit reliability concerns may impose a limit on die temperature, beyond which reliable operation may be at risk. Thus, for a given package thermal resistance, $R_{thermal}$, the maximum allowable heat transfer rate (and hence power dissipation at the die), $q_{allowable}$, may be determined as the quotient of allowable temperature gradient and package thermal resistance, $q_{allowable}=\Delta T_{allowable}/R_{thermal}$. Therefore, where system performance correlates to power dissipation, a reduction in package thermal resistance may result in a corresponding increase in system performance.

Figure 2:
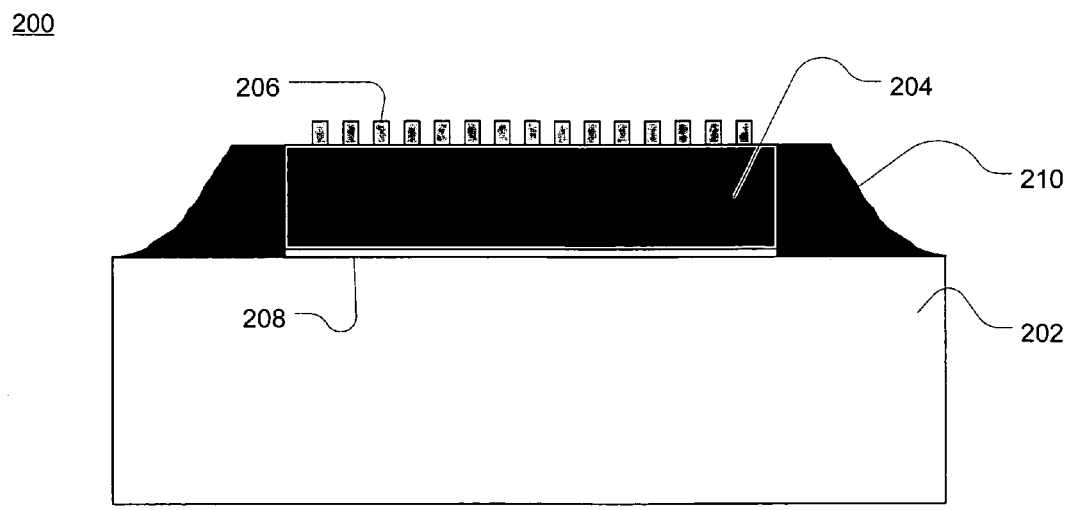
FIG. 2 illustrates a side cross-sectional view of an embodiment of a partial package assembly including a die coupled to a heat spreader using a thermal interface material and a thermal interface material ("TIM") dam confining the interface material.

With respect to FIG. 2, a reduction of package thermal resistance may result from a reduction in thickness of a thermal interface material ("TIM") 208 between a die 204 and a heat spreader 202. Where the die 204 and heat spreader 202 are different materials, reduced TIM 208 thickness may increase mechanical stress within the die 204 that results from differing rates of thermal expansion and contraction between the die 204 and heat spreader 202. Thus, through addressing a thermal challenge, a derivative mechanical consideration may arise.

FIG. 1 illustrates a typical graph of compressive mechanical stress versus solder phase change temperature for a die 204 soldered to a heat spreader 202 with a given thickness of TIM. With reference to FIG. 1, a solder interface 208 with higher melting temperature may result in higher mechanical stress than a solder interface 208 with lower melting temperature. Higher mechanical stresses may adversely affect long term package reliability or integrated circuit performance, or both. Thus, an embodiment of a solder TIM with reduced melting temperature may result in an improvement of long term reliability or integrated circuit performance, or both.

Turning now to package assembly, a typical manufacturing consideration may be to maintain a temperature hierarchy, where processes occur in order of decreasing process temperature. For example, where multiple soldering processes occur, each at a different temperature, typical manufacturing considerations may dictate that each subsequent soldering process occur at a lower temperature to avoid damage to previously completed solder joints.

A further manufacturing consideration may derive, from thermal considerations that emphasize maintaining control of TIM thickness. Again referring to FIG. 2, an assembly process may more readily control TIM 208 thickness if a heat spreader 202 is attached to a backside of a die 204 prior to soldering a front side of the die 204 to a substrate (not shown) with solder bumps 206.

Combining the above may present conflicting considerations for an assembly process. As mentioned, a solder TIM 208 with low melting temperature may reduce mechanical stresses in the die 204. If the melting temperature of the TIM 208 is less than that of the solder balls 206, competing assembly considerations may arise in light of maintaining a descending temperature hierarchy. In other words, maintaining a temperature hierarchy may run counter to using a low temperature solder attach of a heat spreader 202 to a die 204 while maintaining control over TIM 208 thickness. Conversely, using a high temperature solder in lieu of a low temperature solder, enabling a descending temperature hierarchy, may run counter to considerations of mechanical stress. Thus, an assembly process for an integrated circuit package may need to balance competing thermal, mechanical, and manufacturing considerations.

Referring again to FIG. 2, a TIM dam 210 added during assembly addresses the competing priorities by containing a solder TIM that may undergo solid to liquid phase change in a subsequent, higher temperature process. FIG. 2 illustrates a cross-section view of a partial package assembly 200 that may result from adding the TIM dam 210. In addition to a die 204 coupled to a heat spreader 202 with a reduced temperature TIM 208, assembly 200 also includes a thermal interface material dam 210 enclosing a peripheral surface of the TIM. With a TIM dam 210 in place, the assembly 200 may later undergo a soldering process beyond the TIM 208 phase change temperature, for example to couple a die 204 to a package substrate (not shown) via solder bumps 206, without damage to the lower temperature solder joint 208 between the die 204 and heat spreader 202. In a subsequent higher temperature process, the solder joint 208 will change state, but will not run out because the TIM dam 210 will contain the liquid solder 208. Solder bumps 206 may provide electrical connectivity or structural support to the die 204, or both.

A thermal interface material dam may be any component, material, feature, or other aspect of a component or material used in packaging a semiconductor that prevents thermal interface material loss during or after phase transition of the TIM. An embodiment of the thermal interface material dam 210 illustrated in FIG. 2 may be an epoxy (e.g., a mixture of a curable polymer system), a curable monomer (e.g., cyanate esters, vinyl or acrylic resins with free radical initiators, e.g., peroxides, or a silicone rubber), a plastic or rubber barrier, or even a solder with phase change temperature in excess of the TIM 208.

Again to FIG. 2, the die 204 may include a microprocessor, a graphics processor, a memory controller, or a chipset, or a combination thereof. Further, the die 204 may be between approximately $\frac{1}{25}$ and $\frac{1}{15}$ the thickness of the heat spreader 202. For example, a die 204 thickness may be approximately 125 micron, and a heat spreader thickness may be approximately 2400 micron.

Assembly 200 may include a thermal interface material 208 with a solid-liquid phase change temperature less than about 183° C., slightly above the solid-liquid phase change temperature of common, low temperature solder interface materials. For example, an embodiment may include a thermal interface material 208 including Indium, Indium-Silver, bismuth, an alloy of bismuth, a lead based solder, or a combination thereof. A further embodiment may use a representative TIM thickness of approximately 10 micron. TIM thickness control may be achieved by dispensing a predetermined volume of TIM 208 solder prior to attachment of the die 204 to the heat spreader 202.

A heat spreader 202 may be formed of many materials, for example, metals such as copper, aluminum, or tin; epoxy; or composites; or any other material suitable to facilitate thermal, mechanical, and assembly considerations. Heat spreader 202 may alternatively be formed of a combination of materials. Further, heat spreader 202 may form a plate (approximating a high aspect ratio rectangular prism) or a more complex shape, such as a heat sink with fins in an air cooled application or an evaporator, possibly with microchannels, in liquid cooling or refrigeration applications.

Figure 3:
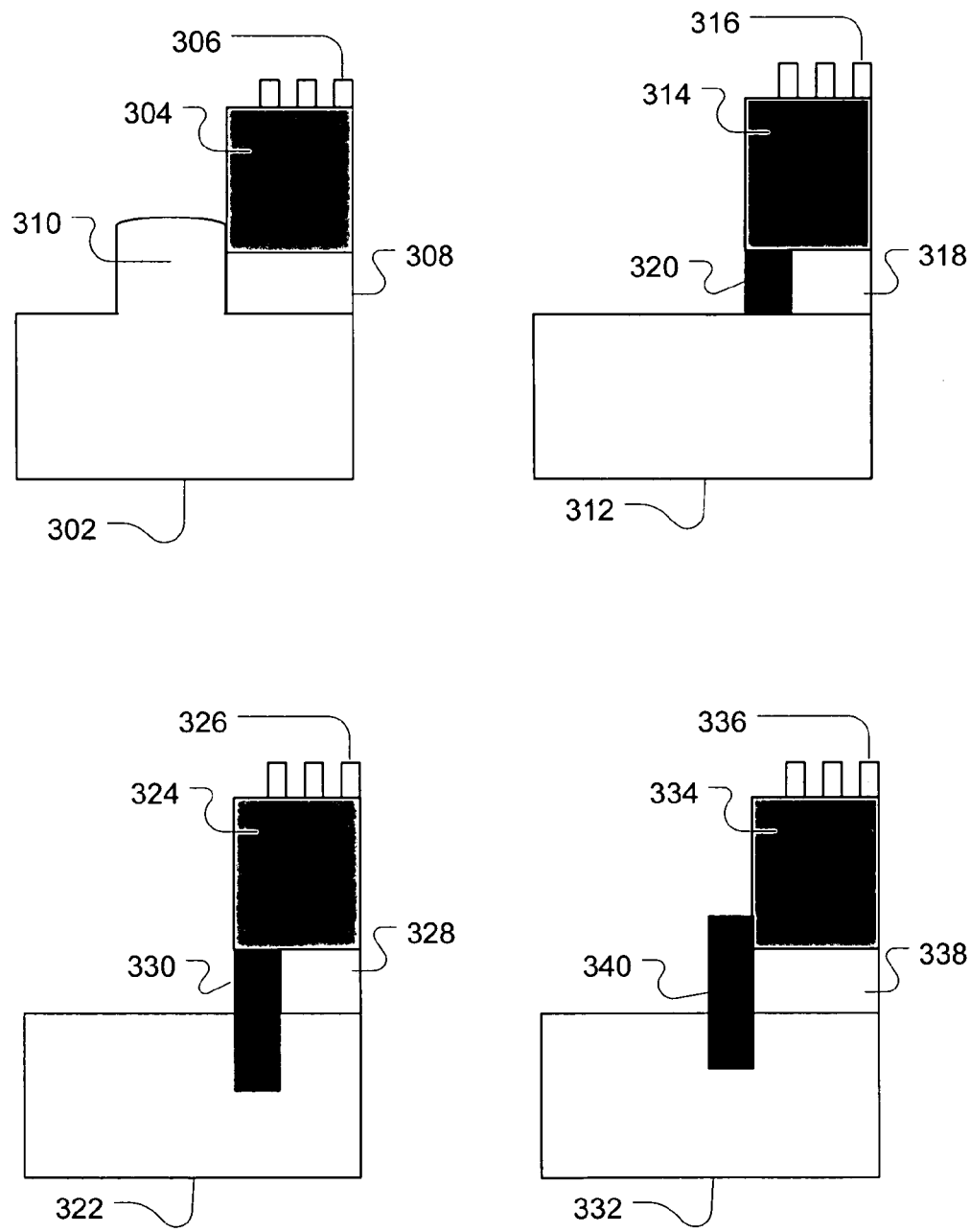
FIG. 3 illustrates a side cross-sectional view of embodiments alternative to that illustrated in FIG. 2.

FIG. 3 illustrates four alternative embodiments to the one shown in FIG. 2. The illustrations of FIG. 3 show only a representative portion of the partial package assemblies in the vicinity of each different embodiment of a TIM dam. Each illustrated partial package assembly has several elements similar to the other illustrated assemblies: a heat spreader 302, 312, 322, 332, a die 304, 314, 324, 334, solder bumps 306, 316, 326, 336, and a solder interface 308, 318, 328, 338. However, each illustration shows a different embodiment of a TIM dam to partially illustrate the breadth of possibilities possible in constructing a TIM dam. For example, a TIM dam 310 may be integral to, and of the same material as, the heat spreader 302 and may be formed using a machining, stamping, or chemical etching process. An alternative embodiment of a TIM dam 320 may be disposed between the die 314 and the heat spreader 312. A TIM dam 330 disposed between the die 324 and heat spreader 322 may further be seated in a channel or groove of the heat spreader 322. Yet another embodiment of a TIM dam 340 may be seated in a channel or groove of the heat spreader 332 and enclose a peripheral surface of the TIM 338 and partially or wholly enclose a peripheral surface of the die 334. A TIM dam 320, 330, 340 may be formed of epoxy (e.g., a mixture of a curable polymer system), a curable monomer (e.g., cyanate esters, vinyl or acrylic resins with free radical initiators, e.g., peroxides, or a silicone rubber), a plastic or rubber barrier, or even a solder with phase change temperature in excess of the TIM 318, 328, 338. Further, a TIM dam 320, 330, 340 may be a separate component, for example an O-ring or gasket.

Figure 4:
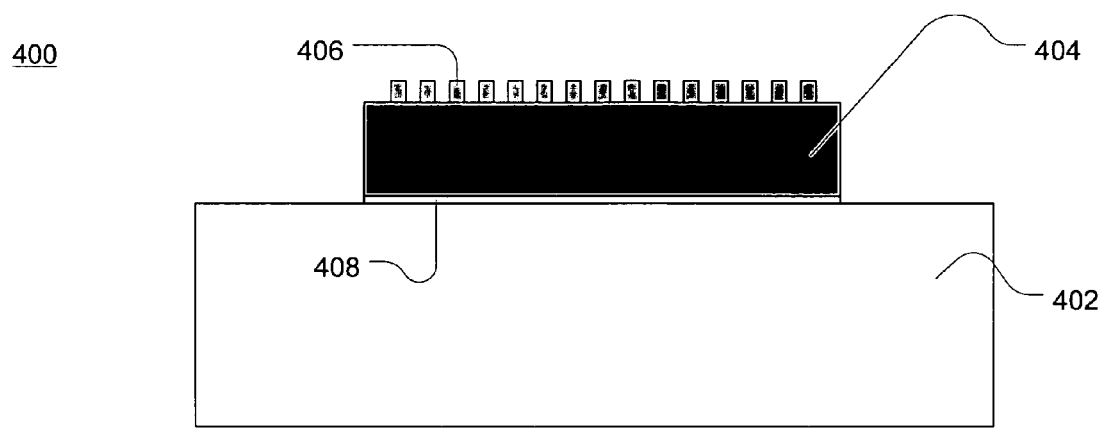
FIG. 4 illustrates a side cross sectional view of an embodiment of a partial package assembly including a die coupled to a heat spreader using a solder TIM.

Turning to FIG. 4, the figure illustrates an embodiment of a partial package assembly 400 during manufacture. The illustrated embodiment includes a thermal interface material 408 disposed between a die 404 and a heat spreader 402. The interim assembly 400 illustrated includes a die 404 with solder bumps 406 that may provide electrical connectivity or structural support to the die. An embodiment of the interim assembly 400 may include a thermal interface material 408 with a lower melting temperature than the solder bumps 406. Further, solder bumps 406, may be soldered to a package substrate in a subsequent assembly process.

Figure 5:
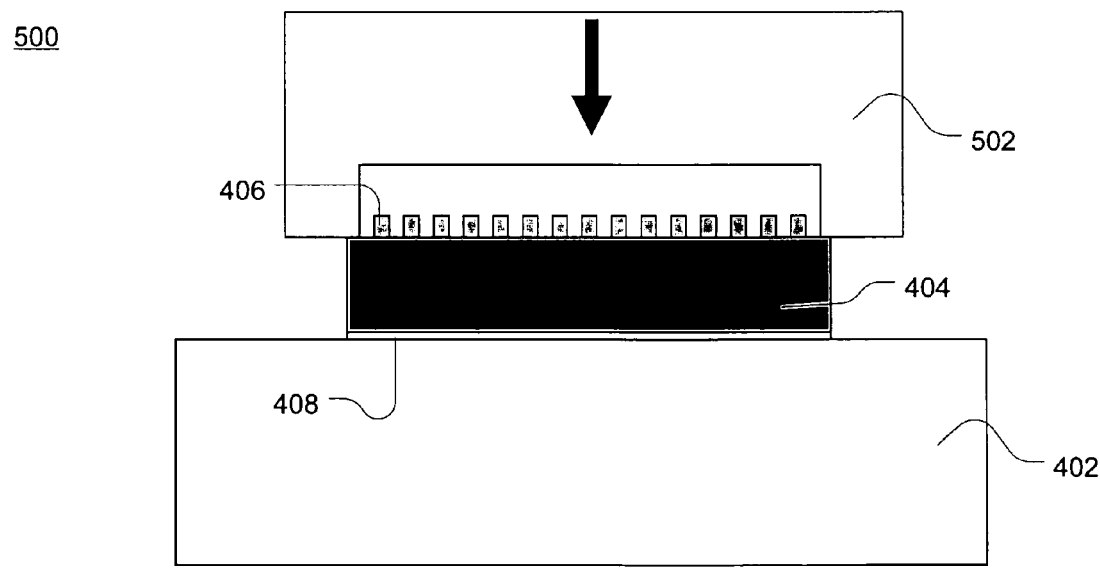
FIG. 5 illustrates the structure of FIG. 4 with a cap compressing the TIM disposed between the die and heat spreader.

Subsequent assembly processes may result in a partial assembly 500 similar to the illustration of FIG. 5. A cap 502 may compress the thermal interface material 408 between the die 404 with solder bumps 406 and heat spreader 402. The cap 5020 may interface with the die 404 and enclose solder bumps 406, avoiding damage to solder bumps 406 while still providing a compressive force.

Figure 6:
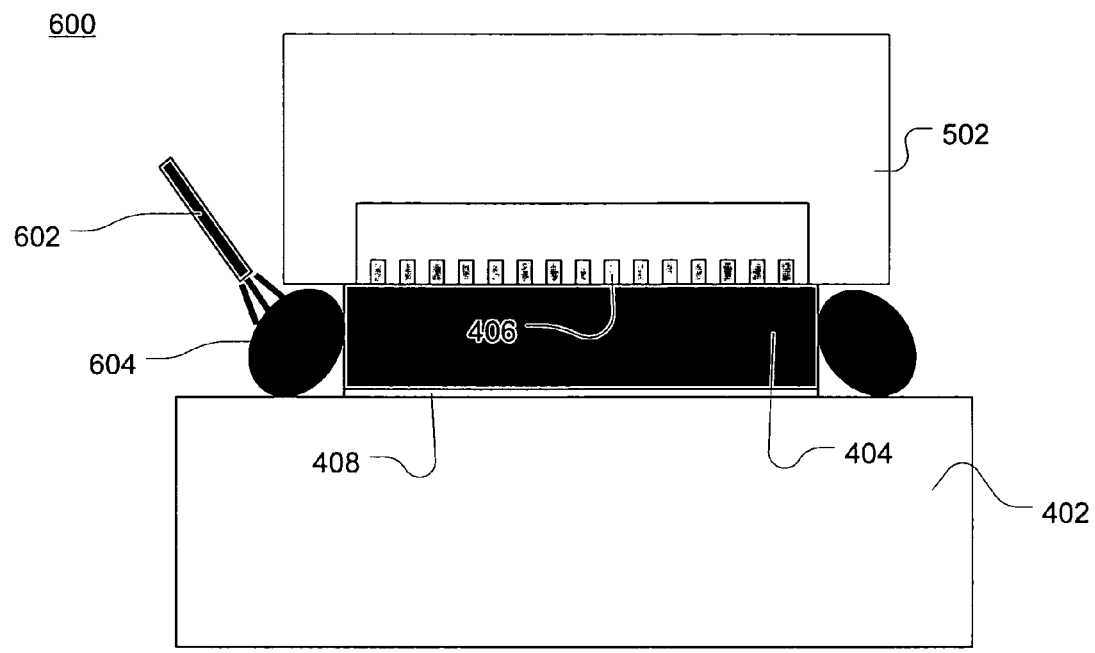
FIG. 6 illustrates the structure of FIG. 5 undergoing a material dispensing process forming a TIM dam.

FIG. 6 illustrates a partial assembly 600, similar to that illustrated in FIG. 4, undergoing a material dispensing process to partially form a thermal interface material dam. An embodiment of a material dispensing process may include dispensing from a nozzle 602 a material 604 while cap 502 compresses a thermal interface material 408 between a die 404 with solder bumps 406 and a heat spreader 402. The cap 502 may enclose the solder bumps 406 and prevent the material 604 from contaminating the solder bumps 406. In an embodiment similar to that illustrated in FIG. 6, the material 604 may enclose a peripheral surface of a thermal interface material 408. In an alternative embodiment, as discussed above with reference to FIG. 3, the material 604 may be disposed between the die 404 and heat spreader 402.

The material 604 may be an epoxy (e.g., a mixture of a curable polymer system), a curable monomer (e.g., cyanate esters, vinyl or acrylic resins with free radical initiators, e.g., peroxides, or a silicone rubber), or even a malleable plastic.

Figure 7:
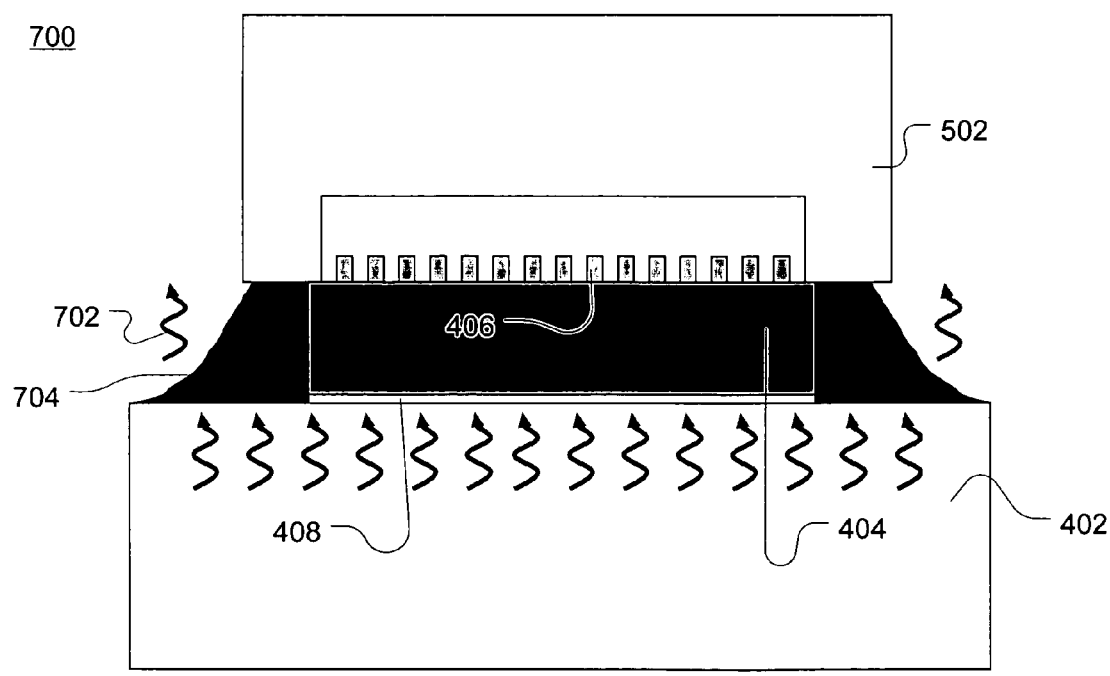
FIG. 7 illustrates the structure of FIG. 6, with the package assembly and TIM dam undergoing elevated temperature cure.

FIG. 7 illustrates a partial assembly 700, similar to that illustrated in FIG. 6, during cure or hardening, and subsequent to deposition, of a material forming a thermal interface material dam 704. During cure, a cap 502 may compress a thermal interface material 408 between a die 404 with solder bumps 406 and a heat spreader 402. Energy added to elevate the interim assembly 700 temperature is illustrated by wavy line 702.

The time required to cure the interface material dam 704 may correlate inversely to cure temperature. Thus, a thermal interface material dam 704 cure may be accelerated by elevating the assembly 700 temperature. An example of an elevated temperature cure may be one where the temperature remains below the TIM 408 phase change temperature. Another example of an elevated temperature cure may be one where the temperature rises above the TIM 408 phase change temperature. A further exemplary curing process may use two temperatures. The first assembly temperature may be elevated, but kept below the melting temperature of the TIM 408. The thermal interface material dam 704 may partially cure or harden sufficiently to contain a liquid phase TIM 408, at which point, the assembly temperature may again be elevated to the second temperature, above the phase change temperature of the TIM 408.

Figure 8:
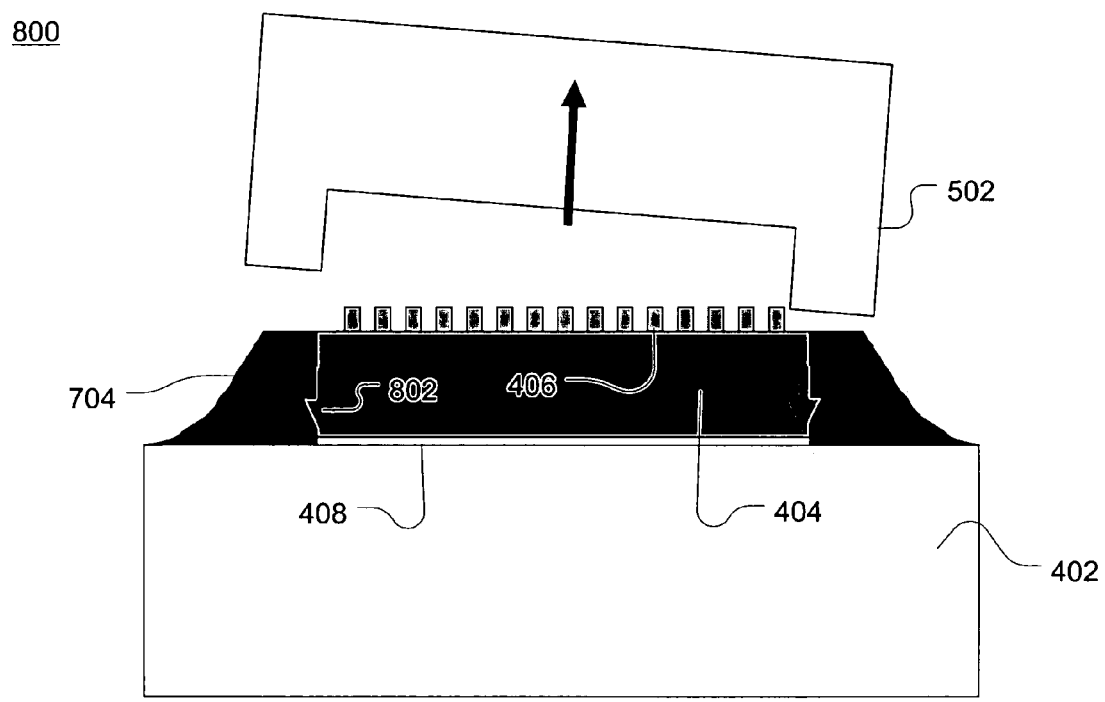
FIG. 8 illustrates the structure of FIG. 7 following elevated temperature cure and undergoing removal of the cap.

FIG. 8 illustrates a partial assembly 800, similar to that illustrated in FIG. 7, during removal of the cap 502. Upon removal of the cap 502, the partially or wholly cured thermal interface material dam 704 may maintain a compressive load, illustrated by arrow 802, on the TIM 408 by way of its coupling to the die 404 and heat spreader 402. Absent a compressive load 802, after many temperature cycles, a TIM 408 may degrade at or near corners of the die 404 and result in an increase of package thermal resistance over time. The compressive load 802 maintained by a thermal interface material dam 704 may reduce the degradation over time. Upon removal of the cap 502, the partial assembly as illustrated in FIG. 2 results.

Figure 9:
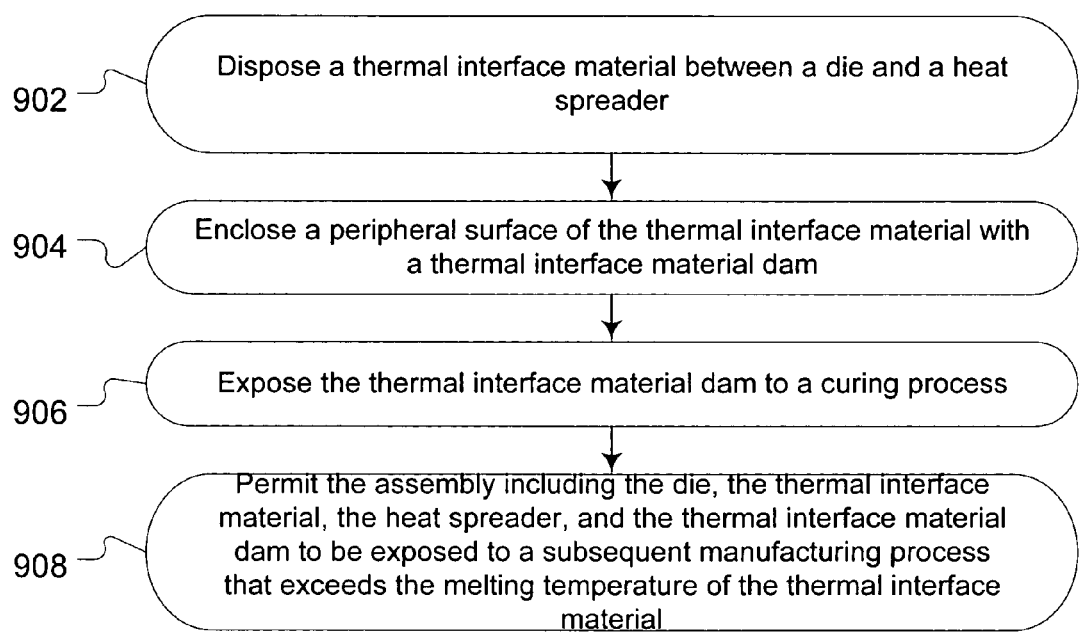
FIG. 9 illustrates a method of packaging a semiconductor, including forming a thermal interface material dam.

FIG. 9 illustrates a method of assembling an integrated circuit package in accordance with the above described partial assemblies. An assembly method may include disposing a thermal interface material between a die and a heat spreader 902. The method includes a subsequent process to enclose a peripheral surface of the TIM with TIM dam 904. The method further includes exposing the TIM dam to a curing process 906. Still further, the method includes permitting the assembly including the die, the TIM, the heat spreader, and the TIM dam to be exposed to a subsequent manufacturing process that exceeds the melting temperature of the TIM 908.

With reference to the method illustrated in FIG. 9, the die may include a microprocessor, a graphics processor, a memory controller, or a chipset, or a combination thereof. An embodiment of the thermal interface material disposed between the die and heat spreader may undergo solid-liquid phase change below about 183° C. Yet another embodiment of the thermal interface material disposed between the die and heat spreader may include Indium, Indium-Silver, bismuth, an alloy of bismuth, a lead based solder, or a combination thereof. The thermal interface material dam may be an epoxy (e.g., a mixture of a curable polymer system), a curable monomer (e.g., cyanate esters, vinyl or acrylic resins with free radical initiators, e.g., peroxides, or a silicone rubber), a malleable plastic, or even an O-ring or gasket. The die may be between ⅕ and ½₅ the thickness of a heat spreader.

Figure 10:
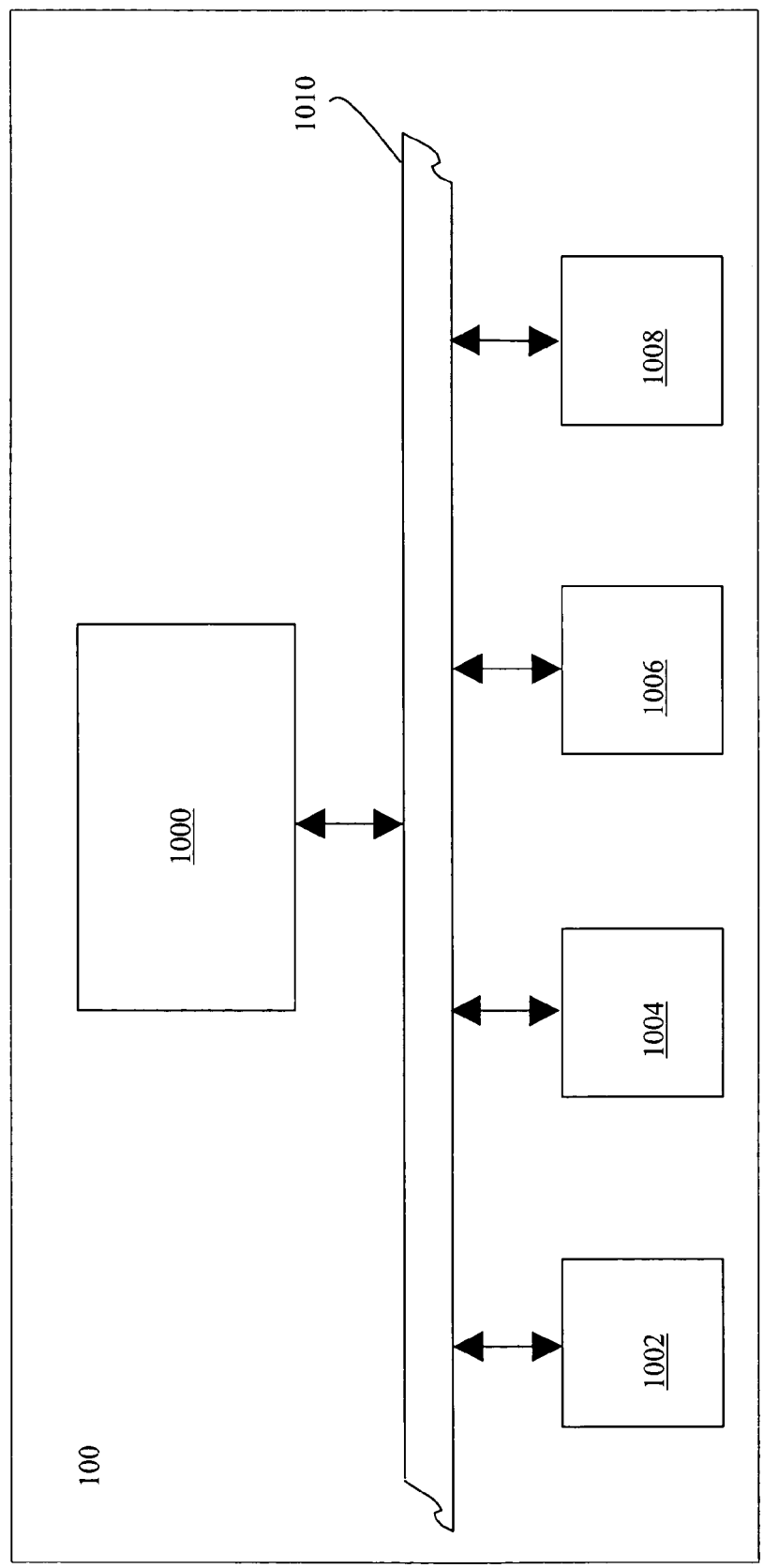
FIG. 10 illustrates a block diagram of an embodiment of a system including an integrated circuit package with a thermal interface material dam.

FIG. 10 illustrates a schematic representation of one of many possible system embodiments. In an embodiment, a package containing an integrated circuit 1000 may include a thermal interface material dam. A system embodiment includes a TIM dam similar to any described above. In another embodiment, the integrated circuit may include a microprocessor. In an alternate embodiment, an integrated circuit package 1000 may include an application specific integrated circuit (ASIC). Integrated circuits found in chipsets (e.g., graphics, sound, and control chipsets) or memory may also be packaged in accordance with embodiments herein described.

In an embodiment similar to that illustrated in FIG. 10, a system 100 may also include a main memory 1002, a graphics processor 1004, a mass storage device 1006, and an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a flash drive, a compact disk drive (CD), a digital versatile disk drive (DVD), and so forth. Examples of the input/output modules 1008 include but are not limited to a keyboard, cursor control devices, a display, a network interface, and so forth. Examples of the bus 1010 include but are not limited to a peripheral control interface (PCI) bus, PCI Express bus, Industry Standard Architecture (ISA) bus, and so forth. In various embodiments, the system 100 may be a wireless mobile phone, a personal digital assistant, a pocket PC, a tablet PC, a notebook PC, a desktop computer, a set-top box, an audio/video controller, a DVD player, a network router, a network switching device, or a server.

Although specific embodiments have been illustrated and described herein for purposes of description of an embodiment, those of ordinary skill in the art will appreciate that a wide variety of alternate and/or equivalent implementations calculated to achieve similar purposes may be substituted for the embodiments shown and described without departing from the scope of the present disclosure. For example, alternative embodiments may exist where a heat spreader integrates a thermal interface material dam as in FIG. 3. Another embodiment may couple multiple die to a heat spreader and may further include one or more thermal interface material dams. Still another embodiment may use discrete components, e.g., an O-ring or gasket, forming a thermal interface material dam. Yet another embodiment may exist wherein a heat spreader may be further coupled to other components, e.g., retention mechanism components, power delivery components, or thermal solution components.

Thus, those with skill in the art will readily appreciate the very wide variety of possible embodiments. This detailed description is intended to cover any adaptations or variations of embodiments. Therefore, it is manifestly intended that only the claims and the equivalents thereof be taken as limiting.

What is claimed is:

1. A semiconductor package comprising:
   a die including an integrated circuit;
   a volume of thermal interface material disposed between the die and a heat spreader;
   a thermal interface material dam disposed abutting the die and the heat spreader and, further, enclosing a peripheral surface of the thermal interface material, wherein the thermal interface material dam is integrated with and of the same material as the heat spreader.

2. The semiconductor package of claim 1, wherein the integrated circuit further comprises a selected one of the group including microprocessor, a graphics processor, a memory controller, or a chipset, or a combination thereof.

3. The semiconductor package of claim 1, wherein the thermal interface material undergoes solid-liquid phase change at less than 183° C.

4. The semiconductor package of claim 1, wherein thermal interface material further comprises one selected from the group including Indium, Indium-Silver, bismuth, an alloy of bismuth, a lead based solder, and a combination thereof.

5. The semiconductor package of claim 1, wherein a material forming the thermal interface material dam comprises a selected one from the group including an epoxy, a curable monomer, a plastic, or a combination thereof.

6. The semiconductor package of claim 1, wherein the ratio of die thickness to heat spreader thickness ranges from 1:10 to 1:30, inclusive.

7. A method of packaging a semiconductor comprising:
   disposing a volume of thermal interface material between a die and a heat spreader;
   forming a thermal interface material dam abutting the die and the heat spreader, thereby forming an assembly wherein the thermal interface material dam is disposed between the die and the heat spreader.

8. The method of claim 7, further comprising:
   exposing the assembly to a thermal interface material dam curing process.

9. The method of claim 7, further comprising:
   subsequently permitting the assembly to be exposed to a temperature in excess of a solid-liquid phase change temperature of the thermal interface material.

10. The method of claim 7, wherein the integrated circuit comprises a selected one of the group including microprocessor, a graphics processor, a memory controller, or a chipset, or a combination thereof.

11. The method of claim 7, wherein the thermal interface material undergoes solid-liquid phase change at less than approximately 183° C.

12. The method of claim 7, wherein thermal interface material further comprises a selected one of the group including Indium, Indium-Silver, bismuth, an alloy of bismuth, a lead based solder, and a combination thereof.

13. The method of claim 7, wherein a material forming the thermal interface material dam comprises a selected one of the group including an epoxy, a curable monomer, a plastic, or a combination thereof.

14. The method of claim 7, wherein the ratio of die thickness to heat spreader thickness ranges from 1:10 to 1:30, inclusive.

15. A system comprising:
   a semiconductor package including
      a die including an integrated circuit,
      a volume of thermal interface material disposed between the die and a heat spreader,
      a thermal interface material dam coupled to the die and the heat spreader and, further, enclosing a peripheral surface of the thermal interface material; and
   a mass storage device coupled to the package.

16. The system of claim 15, wherein the integrated circuit comprises a selected one of the group including microprocessor, a graphics processor, a memory controller, or a chipset, or a combination thereof.

17. The system of claim 15, further comprising:
a dynamic random access memory coupled to the integrated circuit; and
an input/output interface coupled to the integrated circuit.

18. The system of claim 17, wherein the input/output interface comprises a networking interface.

19. The system of claim 15, wherein the system is a selected one of a group comprising a set-top box, a media-center personal computer, a digital versatile disk player, a server, a personal computer, a mobile personal computer, a network router, and a network switching device.

20. A semiconductor package comprising:
a die including an integrated circuit;
a volume of thermal interface material disposed between the die and a heat spreader;
a thermal interface material dam disposed abutting the die and the heat spreader and, further, enclosing a peripheral surface of the thermal interface material, wherein the thermal interface material dam is seated in a channel of the heat spreader.

21. The semiconductor package of claim 20, wherein the thermal interface material dam is disposed between the die and the heat spreader.

22. The semiconductor package of claim 20, wherein the thermal interface material dam encloses a peripheral surface of the thermal interface material and at least partially encloses a peripheral surface of the die.

* * * * *